(12) United States Patent
Shinohara et al.

(10) Patent No.: US 11,901,325 B2
(45) Date of Patent: Feb. 13, 2024

(54) MULTILAYER SUBSTRATE

(71) Applicant: DEXERIALS CORPORATION, Tokyo (JP)

(72) Inventors: Seiichiro Shinohara, Kanuma (JP); Yasushi Akutsu, Utsunomiya (JP); Tomoyuki Ishimatsu, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 392 days.

(21) Appl. No.: 15/543,113

(22) PCT Filed: Jan. 13, 2016

(86) PCT No.: PCT/JP2016/050877
§ 371 (c)(1),
(2) Date: Jul. 12, 2017

(87) PCT Pub. No.: WO2016/114320
PCT Pub. Date: Jul. 21, 2016

(65) Prior Publication Data
US 2017/0358549 A1     Dec. 14, 2017

(30) Foreign Application Priority Data
Jan. 13, 2015    (JP) ................ 2015-004596

(51) Int. Cl.
*H01L 23/498* (2006.01)
*H01L 23/48* (2006.01)
(Continued)

(52) U.S. Cl.
CPC .............. *H01L 24/27* (2013.01); *H01L 24/11* (2013.01); *H01L 24/13* (2013.01); *H01L 24/14* (2013.01);
(Continued)

(58) Field of Classification Search
CPC ......... H01L 24/11; H01L 24/13; H01L 24/14; H01L 24/16; H01L 24/17; H01L 24/27;
(Continued)

(56) References Cited

U.S. PATENT DOCUMENTS 5,866,044 A * 2/1999 Saraf ................. H05K 3/321
                                                              252/514
5,965,064 A    10/1999 Yamada et al.
(Continued)

FOREIGN PATENT DOCUMENTS

JP    S62-34773 U    2/1987
JP    H03-62411 A    3/1991
(Continued)

OTHER PUBLICATIONS

Mar. 22, 2016 Search Report issued in International Patent Application No. PCT/JP2016/050877.
(Continued)

*Primary Examiner* — Xiaoming Liu
(74) *Attorney, Agent, or Firm* — Oliff PLC

(57) ABSTRACT

Provided is a multilayer substrate including laminated semiconductor substrates each having a penetrating hole (hereinafter referred to as through hole) having a plated film formed in the inner surface. The multilayer substrate has excellent conduction characteristics and can be manufactured at low cost. Conductive particles are selectively present at a position where the through holes face each other as viewed in a plan view of the multilayer substrate. The multilayer substrate has a connection structure in which the facing through holes are connected by the conductive particles, and the semiconductor substrates each having the through hole are bonded by an insulating adhesive.

20 Claims, 11 Drawing Sheets

(51) Int. Cl.
*H01L 23/00* (2006.01)
*H01L 25/065* (2023.01)
*H01L 25/00* (2006.01)

(52) U.S. Cl.
CPC .............. *H01L 24/16* (2013.01); *H01L 24/17* (2013.01); *H01L 24/29* (2013.01); *H01L 24/73* (2013.01); *H01L 24/81* (2013.01); *H01L 24/83* (2013.01); *H01L 24/92* (2013.01); *H01L 25/0657* (2013.01); *H01L 25/50* (2013.01); *H01L 24/32* (2013.01); *H01L 2224/111* (2013.01); *H01L 2224/11003* (2013.01); *H01L 2224/131* (2013.01); *H01L 2224/133* (2013.01); *H01L 2224/1308* (2013.01); *H01L 2224/1319* (2013.01); *H01L 2224/1369* (2013.01); *H01L 2224/13078* (2013.01); *H01L 2224/13139* (2013.01); *H01L 2224/13144* (2013.01); *H01L 2224/13147* (2013.01); *H01L 2224/13155* (2013.01); *H01L 2224/13157* (2013.01); *H01L 2224/13164* (2013.01); *H01L 2224/13686* (2013.01); *H01L 2224/1403* (2013.01); *H01L 2224/16058* (2013.01); *H01L 2224/16059* (2013.01); *H01L 2224/16146* (2013.01); *H01L 2224/16147* (2013.01); *H01L 2224/16227* (2013.01); *H01L 2224/16235* (2013.01); *H01L 2224/16237* (2013.01); *H01L 2224/17107* (2013.01); *H01L 2224/271* (2013.01); *H01L 2224/27003* (2013.01); *H01L 2224/27515* (2013.01); *H01L 2224/2919* (2013.01); *H01L 2224/2929* (2013.01); *H01L 2224/29082* (2013.01); *H01L 2224/29387* (2013.01); *H01L 2224/32145* (2013.01); *H01L 2224/32225* (2013.01); *H01L 2224/73104* (2013.01); *H01L 2224/81101* (2013.01); *H01L 2224/81122* (2013.01); *H01L 2224/81903* (2013.01); *H01L 2224/83101* (2013.01); *H01L 2224/83122* (2013.01); *H01L 2224/83203* (2013.01); *H01L 2224/83856* (2013.01); *H01L 2224/9211* (2013.01); *H01L 2225/06513* (2013.01); *H01L 2225/06517* (2013.01); *H01L 2225/06541* (2013.01); *H01L 2225/06565* (2013.01); *H01L 2225/06589* (2013.01); *H01L 2924/00015* (2013.01); *H01L 2924/3841* (2013.01)

(58) Field of Classification Search
CPC ......... H01L 24/29; H01L 24/73; H01L 24/81; H01L 24/83; H01L 24/92; H01L 25/0657; H01L 25/50
See application file for complete search history.

(56) References Cited

U.S. PATENT DOCUMENTS

| | | | | |
|---|---|---|---|---|
| 6,982,488 | B2 * | 1/2006 | Shin ................ | H01L 23/13 257/678 |
| 7,649,249 | B2 * | 1/2010 | Noguchi ............ | H01L 23/3677 257/686 |
| 7,683,473 | B2 | 3/2010 | Kasai et al. | |
| 9,515,054 | B2 * | 12/2016 | Lee ................ | H01L 25/071 |
| 2002/0076537 | A1 | 6/2002 | Chuang et al. | |
| 2004/0177921 | A1 | 9/2004 | Yamauchi | |
| 2006/0197181 | A1 | 9/2006 | Noguchi | |
| 2007/0182021 | A1 * | 8/2007 | Bauer ................ | H01L 24/10 257/E23.021 |
| 2010/0171209 | A1 * | 7/2010 | Tanie ................ | H01L 25/50 257/E21.705 |
| 2012/0328794 | A1 | 12/2012 | Ito et al. | |
| 2016/0093598 | A1 * | 3/2016 | Jo ................ | H01L 23/36 257/713 |

FOREIGN PATENT DOCUMENTS

| | | | |
|---|---|---|---|
| JP | H04-301382 | A | 10/1992 |
| JP | H05-182973 | A | 7/1993 |
| JP | H08-330736 | A | 12/1996 |
| JP | H11-241054 | A | 9/1999 |
| JP | 2001-237365 | A | 8/2001 |
| JP | 2002-110897 | A | 4/2002 |
| JP | 2003-282819 | A | 10/2003 |
| JP | 2005-277112 | A | 10/2005 |
| JP | 2006-245311 | A | 9/2006 |
| JP | 2006-310082 | A | 11/2006 |
| JP | 2006-339160 | A | 12/2006 |
| JP | 2009-004593 | A | 1/2009 |
| JP | 2010-232492 | A | 10/2010 |
| JP | 2010-251547 | A | 11/2010 |
| JP | 2010-272737 | A | 12/2010 |
| KR | 1999-0037268 | A | 5/1999 |
| KR | 20060069525 | A | 6/2006 |
| KR | 10-0539060 | B1 | 4/2007 |
| KR | 2007-0103185 | A | 10/2007 |
| KR | 20140034909 | A | 3/2014 |
| TW | 201131583 | A | 9/2011 |
| WO | 03/003798 | A1 | 1/2003 |
| WO | WO 2016114320 | A1 * | 7/2016 ............. H01L 24/27 |

OTHER PUBLICATIONS

Jan. 31, 2017 Written Opinion of the International Preliminary Examining Authority issued in International Patent Application No. PCT/JP2016/050877.
Mar. 22, 2016 Written Opinion of the International Searching Authority issued in International Patent Application No. PCT/JP2016/050877.
Apr. 19, 2017 International Preliminary Report on Patentability issued in International Patent Application No. PCT/JP2016/050877.
Aug. 23, 2018 Office Action issued in Korean Patent Application No. 10-2017-7017942.
Nov. 23, 2018 Office Action issued in Chinese Patent Application No. 201680004716.6.
Jun. 21, 2019 Office Action issued in Chinese Patent Application No. 201680004716.6.
Feb. 12, 2019 Office Action issued in Korean Patent Application No. 10-2017-7017942.
Jun. 3, 2019 Office Action issued in Korean Patent Application No. 10-2017-7017942.
Oct. 1, 2019 Office Action issued in Japanese Patent Application No. 2016-004551.
Sep. 30, 2019 Office Action issued in Chinese Patent Application No. 201680004716.6.
Nov. 1, 2019 Office Action issued in Taiwanese Patent Application No. 105101042.
Jun. 1, 2021 Office Action issued in Taiwanese Patent Application No. 109121150.
Sep. 7, 2021 Office Action issued in Japanese Patent Application No. 2020-161100.
Mar. 22, 2022 Office Action issued in Taiwanese Patent Application No. 105101042.
Aug. 22, 2022 Office Action issued in Taiwanese Patent Application No. 109121150.
Jun. 15, 2021 Trial and Appeal Decision issued in Japanese Patent Application No. 2016-004551.
Feb. 17, 2021 Office Action issued in Taiwanese Patent Application No. 105101042.
Mar. 3, 2020 Office Action issued in Taiwanese Patent Application No. 105101042.
Jun. 23, 2020 Office Action issued in Japanese Patent Application No. 2016-004551.
Dec. 23, 2020 Reconsideration Report issued in Japanese Patent Application No. 2016-004551.

* cited by examiner (x-x cross-sectional view)

MULTILAYER SUBSTRATE

TECHNICAL FIELD

The present invention relates to a multilayer substrate.

BACKGROUND ART

In a field of high-density packaging for an IC, a multilayer substrate obtained by laminating semiconductor substrates into which electronic parts such as ICs are incorporated is used.

Examples of the method for manufacturing a multilayer substrate may include a method in which a through electrode having a bump is formed on each semiconductor substrate and the through electrodes of the semiconductor substrates facing each other are connected by reflowing the bumps (Patent Literature 1), and a method in which an anisotropic conductive film having an insulating adhesive layer containing dispersed conductive particles is disposed between facing semiconductor substrates and pressurized under heating to connect through electrodes (Patent Literature 2).

In this case, as shown in FIG. 14, a through electrode 6 is generally formed by (a) preparing a semiconductor substrate 3, (b) forming a penetrating hole 4$h$ in the semiconductor substrate 3, (c) forming a plated film 4$a$ by electroless plating, patterning the plated film while leaving the plated film 4$a$ inside the penetrating hole 4$h$ to form a through hole, and (d) forming a mask of a predetermined pattern and performing electroplating to fill the through hole with a metal 5.

CITATION LIST

Patent Literature

Patent Literature 1: Japanese Patent Application Laid-Open No. 2010-272737
Patent Literature 2: Japanese Patent Application Laid-Open No. Hei. 8-330736

SUMMARY OF INVENTION

Technical Problem

However, a method in which a bump is formed in a through electrode of each semiconductor substrate and the through electrodes of the semiconductor substrates facing each other are connected by reflowing with a solder to thereby laminate the semiconductor substrates has a complex manufacturing step.

In a method in which through electrodes facing each other are connected using an anisotropic conductive film to thereby laminate semiconductor substrates, a step of manufacturing a multilayer substrate can be simplified to some extent. However, the anisotropic conductive film has an insulating adhesive layer containing randomly dispersed conductive particles. Therefore, the conductive particles in the anisotropic conductive film may not be sufficiently disposed between the facing through electrodes of the semiconductor substrates. Accordingly, there is a problem such as ununiform conduction characteristics. On the other hand, there are many conduction particles which do not contribute to connection between the through electrodes, between the facing semiconductor substrates. Therefore, there is also a problem in terms of cost for unnecessary conductive particles.

An object of the present invention is to provide a multilayer substrate which includes semiconductor substrates laminated using an anisotropic conductive film and has excellent conduction characteristics by a simple manufacturing step at low cost.

Solution to Problem

The present inventor has found that when conductive particles in an insulating adhesive of an anisotropic conductive film are selectively disposed relative to a through hole which is formed at the former stage of formation of a through electrode in manufacturing of a multilayer substrate by laminating semiconductor substrates using the anisotropic conductive film, and when through holes of the semiconductor substrates facing each other are connected using the anisotropic conductive film, the facing through holes can be certainly connected by the conductive particles. Further, the inventor has found that the number of conductive particles which do not contribute to connection is decreased, a step of manufacturing the multilayer substrate is significantly simplified, and the manufacturing cost for the multilayer substrate is decreased. The present invention has thus been conceived.

Specifically, the present invention provides a multilayer substrate including semiconductor substrates which each have a through hole and are laminated to each other, wherein conductive particles are each selectively present at a position where the through holes face each other as viewed in a plan view of the multilayer substrate, and the multilayer substrate has a connection structure in which the facing through holes are connected by the conductive particles, and the semiconductor substrates each having the through hole are bonded together by an insulating adhesive.

In particular, the present invention provides a multilayer substrate including a first semiconductor substrate having a through hole and a second semiconductor substrate having a through hole, the first and second semiconductor substrates being laminated to each other, wherein the through hole of the first semiconductor substrate and the through hole of the second semiconductor substrate face each other and are connected by the conductive particles which are selectively disposed between the through holes, and the multilayer substrate has a connection structure in which the first and second semiconductor substrates are bonded by an insulating adhesive.

The present invention provides a method for manufacturing a multilayer substrate in which through holes formed in semiconductor substrates are faced and joined each other. The method includes: putting between the semiconductor substrates each having the through hole an anisotropic conductive film in which conductive particles are selectively disposed in an insulating adhesive layer so as to each correspond to a position where the through holes face each other as viewed in a plan view of the multilayer substrate, and pressurizing the anisotropic conductive film under heating to achieve anisotropic conductive connection of the semiconductor substrates.

In particular, the present invention provides a method for manufacturing a multilayer substrate in which a through hole of a first semiconductor substrate having the through hole and a through hole of a second semiconductor substrate having the through hole are faced and joined each other. The method includes: putting between the first and second semiconductor substrates an anisotropic conductive film in which conductive particles are selectively disposed in an insulating adhesive layer so as to correspond to a disposition of the through holes, and pressurizing the anisotropic conductive film under heating to achieve anisotropic conductive connection of the first and second semiconductor substrates.

Further, as an anisotropic conductive film used in the method for manufacturing a multilayer substrate described above, the present invention provides an anisotropic conductive film in which conductive particles are selectively disposed in an insulating adhesive layer so as to correspond to the disposition of through holes to be connected by the anisotropic conductive film.

Moreover, as an anisotropic conductive film useful in the method for manufacturing a multilayer substrate described above, the present invention provides an anisotropic conductive film including an insulating adhesive layer and conductive particles disposed in the insulating adhesive layer. In the anisotropic conductive film, a conductive particle unit including two or more adjacent conductive particles is formed, and the conductive particle unit contains the plurality of conductive particles different in at least size or type.

Advantageous Effects of Invention

According to the multilayer substrate of the present invention, through holes of semiconductor substrates are certainly connected by conductive particles. Therefore, conduction characteristics are stable.

Further, the through holes are connected by the conductive particles without forming a through electrode in the semiconductor substrate by filling the through hole with a metal, and the number of conductive particles which do not contribute to connection is decreased between the semiconductor substrates. Therefore, the manufacturing cost for the multilayer substrate is significantly decreased. For the same reason, the present invention is also effective in a decrease in number of instrumentation steps.

When a specific anisotropic conductive film is used, the multilayer substrate of the present invention can be manufactured by a simple step.

In particular, when the multilayer substrate has three or more semiconductor substrates which are laminated and a common anisotropic conductive film is used between the laminated semiconductor substrates, the total manufacturing cost for the multilayer substrate can be largely decreased. Therefore, the multilayer substrate of the present invention can be provided at further lower cost.

DESCRIPTION OF EMBODIMENTS

Figure 1:
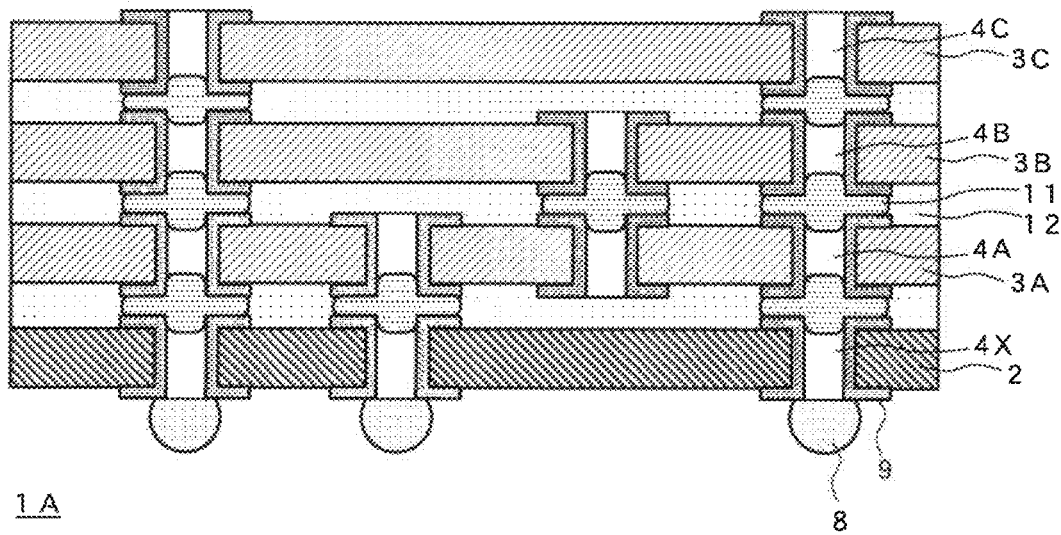
FIG. 1 is a cross-sectional view of a multilayer substrate 1A of an embodiment of the present invention.

Hereinafter, the present invention will be described in detail with reference to the drawings. In the drawings, the same reference numerals denote the same or similar components.

<Connection Structure in Multilayer Substrate>

FIG. 1 is a cross-sectional view of a multilayer substrate 1A of an embodiment of the present invention.

In this multilayer substrate 1A, three semiconductor substrates 3A, 3B, and 3C are laminated on a wiring substrate 2. The semiconductor substrates 3A, 3B, and 3C are each a semiconductor wafer having a semiconductor part such as an IC. In the wiring substrate 2, a through hole 4X is formed. In the semiconductor substrates 3A, 3B, and 3C, through holes 4A, 4B, and 4C are formed, respectively. In a part where the through hole 4X is exposed to the surface of the wiring substrate 2 and respective parts where the through holes 4A, 4B, and 4C are exposed to the surface of the semiconductor substrates, an electrode pad 9 is formed. In the present invention, as the semiconductor substrates 3A, 3B, and 3C, a semiconductor chip may be used. In the present invention, the number of the semiconductor substrates constituting the multilayer substrate which are laminated is not particularly limited.

The multilayer substrate 1A has a connection structure in which the through hole 4A of the first semiconductor substrate 3A and the through hole 4B of the second semiconductor substrate 3B face each other and are electrically connected by conductive particles 11 which are each selectively disposed between the through holes. The conductive particles 11 which are each selectively disposed between the through holes 4A and 4B facing each other in this connection structure means that the conductive particles 11 are mainly present on facing surfaces of the through holes 4A and 4B as viewed in a plan view or in the vicinity of the surfaces and are disposed so that one or more conductive particles 11 are captured by the through holes 4A and 4B. It is preferable that the conductive particles be disposed so that one to about ten conductive particles are captured in terms of both cost and performance. A plurality of conductive particles may overlap each other in a film thickness direction. When a plurality of conductive particles 11 are present on the facing surfaces of the through holes 4A and 4B, the conductive particles may be different in size, type, or the like. When a plurality of conductive particles 11 are disposed on the facing surfaces of the through holes 4A and 4B, precision for positioning the semiconductor substrates 3A and 3B and the conductive particles 11 can be moderated.

The facing surfaces of the first semiconductor substrate 3A and the second semiconductor substrate 3B are bonded by an insulating adhesive 12. The insulating adhesive 12 is formed from an insulating adhesive layer of an anisotropic conductive film described below.

The through hole 4B of the second semiconductor substrate 3B which is connected to the through hole 4A of the first semiconductor substrate 3A, on a side of the third semiconductor substrate 3C, also faces the through hole 4C of the third semiconductor substrate 3C. The through hole 4B of the second semiconductor substrate 3B and the through hole 4C of the third semiconductor substrate 3C are electrically connected by the conductive particles 11 which are each selectively disposed between the through holes. The facing surfaces of the second semiconductor substrate 3B and the third semiconductor substrate 3C are also bonded by the insulating adhesive 12. The through hole 4X of the wiring substrate 2 and the through hole 4A of the first semiconductor substrate 3A are also connected by the conductive particles 11 in the same manner. As described above, the multilayer substrate 1A has a connection structure in which the through hole 4X of the wiring substrate 2 and the through holes 4A, 4B, and 4C of the three semiconductor substrates are connected linearly in a lamination direction of the multilayer substrate. According to the connection structure in which the through holes of the layers are connected linearly, an electrical transmission path is shortened. Therefore, the transmission speed can be improved.

The multilayer substrate 1A is manufactured by connecting layers constituting the multilayer substrate using the anisotropic conductive film of the present invention which has conductive particles in a specific disposition, as described below. In this case, although there are the conductive particles 11 not captured by the through holes 4A and 4B facing each other between the first semiconductor substrate 3A and the second semiconductor substrate 3B, the number of such conductive particles 11 is preferably 5% or less, and more preferably 0.5% or less, relative to the total number of conductive particles present between the first and second semiconductor substrates. In particular, substantially all of the conductive particles 11 may be captured by the through holes 4A and 4B. This also applies to relations between other semiconductor substrates constituting the multilayer substrate 1A. When the number of conductive particles 11 which do not contribute to connection between the through holes 4A, 4B, and 4C is decreased, simulation analysis of performance is easy, and the number of improvement step can be decreased.

<Wiring Substrate>

As the wiring substrate 2 constituting the multilayer substrate 1A, a glass epoxy substrate such as FR4 can be used herein. As the wiring substrate 2, an IC chip or a silicon wafer for forming an IC may be used. The wiring substrate 2 is appropriately selected depending on applications of the multilayer substrate 1A.

On an electrode part of the wiring substrate 2, a solder ball 8 may be provided, if necessary.

<Semiconductor Substrate>

The semiconductor substrates 3A, 3B, and 3C are not particularly limited as long as they have the through holes 4A, 4B, and 4C. For example, a general semiconductor material such as silicon can be used.

The specifications of the through holes 4A, 4B, and 4C can be appropriately set. For example, it is preferable that the through holes 4A, 4B, and 4C be each provided with the electrode pad 9. When the semiconductor substrates 3A, 3B, and 3C are laminated, it is preferable that the through holes 4A, 4B, and 4C be disposed so that the through holes 4A, 4B, and 4C of the semiconductor substrates 3A, 3B, and 3C, respectively, are linearly connected in the thickness direction of the multilayer substrate 1A over at least two semiconductor substrates, and preferably from the front surface to the back surface of the multilayer substrate 1A.

<Mounted Part>

On the multilayer substrate of the present invention, various parts can be mounted, if necessary.

Figure 2:
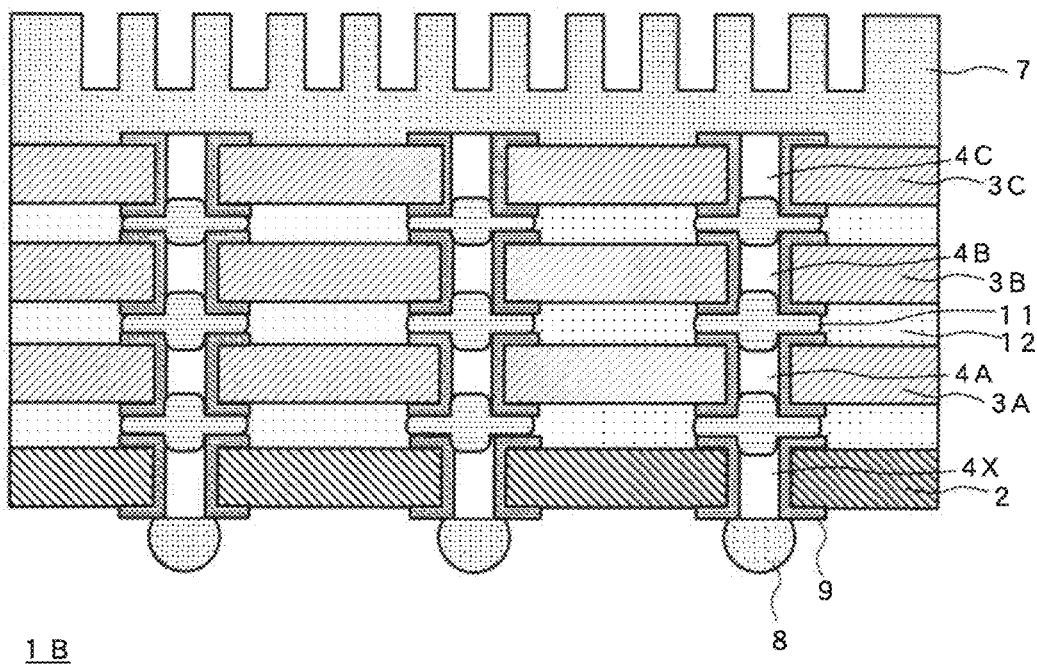
FIG. 2 is a cross-sectional view of a multilayer substrate 1B of an embodiment of the present invention.

For example, a multilayer substrate 1B shown in FIG. 2 has a connection structure in which the through holes 4X, 4A, 4B, and 4C of the layers are linearly connected, and has a heat sink 7 for heat dissipation which is connected to the through hole 4C in the outermost layer. Therefore, in the multilayer substrate 1B, heat emitted from electronic parts or the like, such as an IC, formed in the wiring substrate 2 and the semiconductor substrates 3A, 3B, and 3C can be efficiently dissipated by the heat sink 7.

<Method for Manufacturing Multilayer Substrate>

Figure 3A:
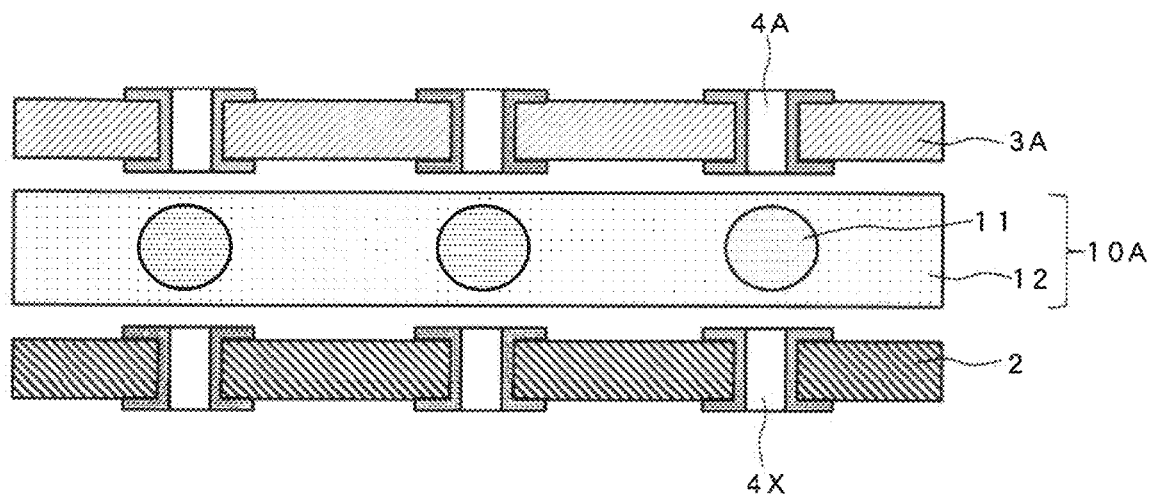
FIG. 3A is a view illustrating a step of manufacturing the multilayer substrate 1B.
Figure 3B:
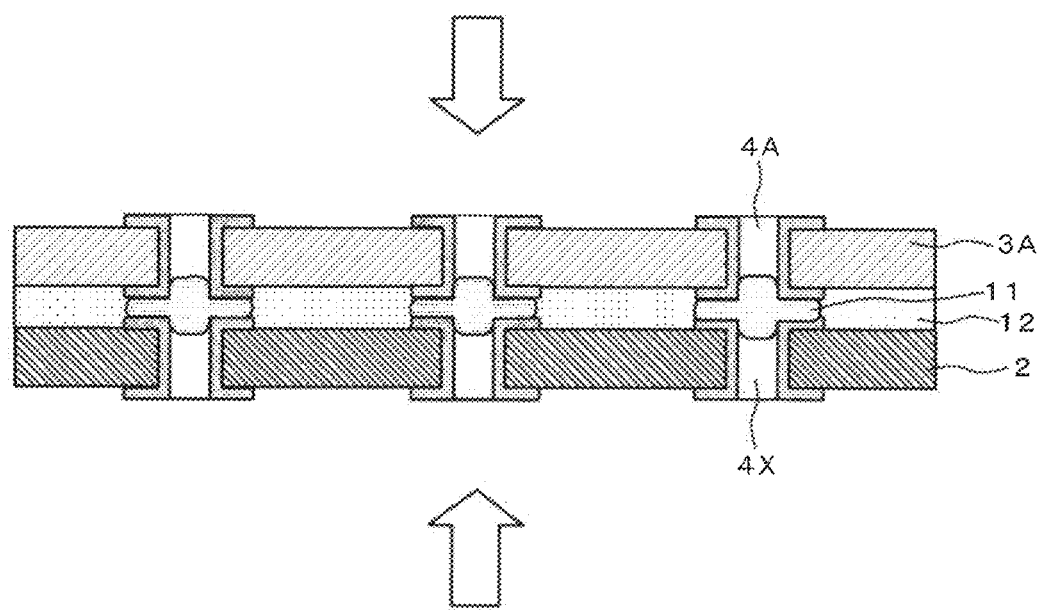
FIG. 3B is a view illustrating a step of manufacturing the multilayer substrate 1B.

In a case of the multilayer substrate 1B shown in FIG. 2, according to the method for manufacturing a multilayer substrate of the present invention, an anisotropic conductive film 10A of the present invention in which the conductive particles 11 are selectively disposed in the insulating adhesive layer 12 so as to correspond to the disposition of the through holes 4X and 4A to be connected is first put between the wiring substrate 2 having the through hole 4X and the semiconductor substrate 3A having the through hole 4A, as shown in FIG. 3A. The anisotropic conductive film 10A is then pressurized under heating, to achieve anisotropic conductive connection between the wiring substrate 2 and the first semiconductor substrate 3A. Thus, a connection structure of two layers, as shown in FIG. 3B, is obtained. More specifically, the wiring substrate 2 and the anisotropic conductive film 10A are positioned and laminated so that the disposition of the through hole 4X to be connected is matched to that of the conductive particles 11. Subsequently, the first semiconductor substrate 3A is also positioned and laminated in the same manner. The wiring substrate 2 and the first semiconductor substrate 3A are pressurized under heating, to achieve anisotropic conductive connection. The positioning may be performed by observing each conductive particle in the anisotropic conductive film which corresponds to the through hole (when a particle group is formed as described below, conductive particles constituting the particle group are used) and the through hole by a CCD or the like and laminating them.

Figure 3C:
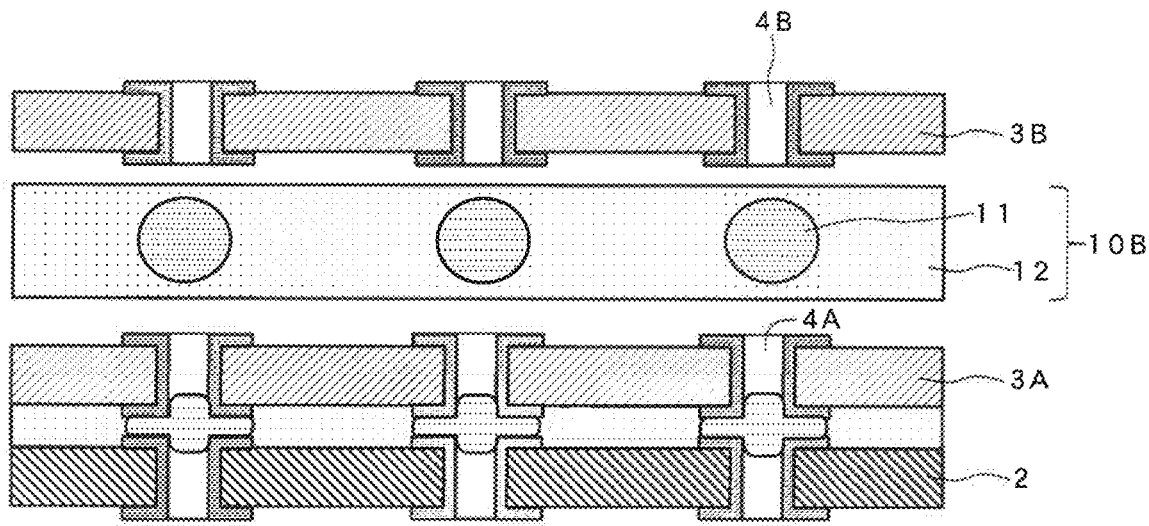
FIG. 3C is a view illustrating a step of manufacturing the multilayer substrate 1B.
Figure 3D:
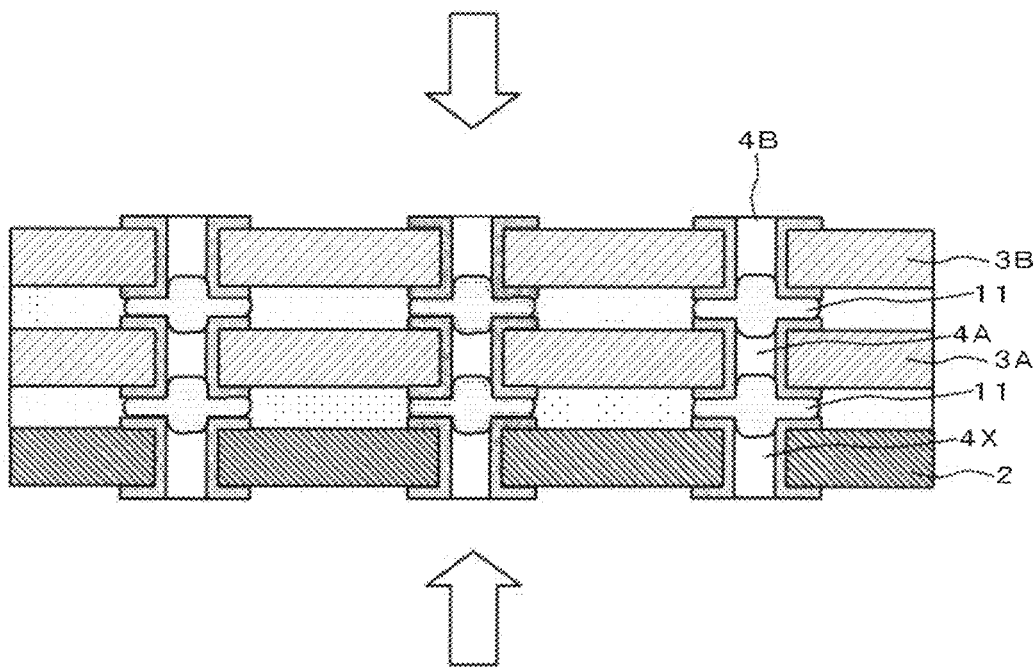
FIG. 3D is a view illustrating a step of manufacturing the multilayer substrate 1B.

As shown in FIG. 3C, the first semiconductor substrate 3A and an anisotropic conductive film 10B are positioned and laminated in the same manner, the second semiconductor substrate 3B is positioned and laminated on them, and the first and second semiconductor substrates 3A and 3B are pressurized under heating, to achieve anisotropic conductive connection between them. Thus, a connection structure of three layers, as shown in FIG. 3D, is obtained. Similarly, an anisotropic conductive film and the third semiconductor substrate 3C are positioned and laminated on the second semiconductor substrate 3B, followed by pressurizing under heating.

In a case of connection between the wiring substrate and the semiconductor substrate or between the semiconductor substrates using the anisotropic conductive film, one substrate of the wiring substrate and the semiconductor substrate, and the anisotropic conductive film are first positioned and laminated, and pressurized under heating to join each conductive particle in the anisotropic conductive film to the through hole of the one substrate. Thus, the conductive particle enters the through hole. A facing substrate is then laminated on the anisotropic conductive film, and joined to the through hole of the previously joined substrate and the conductive particle.

Subsequently, the heat sink 7 is connected to the third semiconductor substrate 3C through a thermally conductive tape or the like, and the solder ball 8 is formed on the electrode pad 9 of the wiring substrate 2. Thus, the multilayer substrate 1B is obtained by an ordinary method. Alternatively, the conductive particle may be provided instead of the solder ball 8.

As a method of positioning the wiring substrate 2 or the semiconductor substrates 3A, 3B, and 3C with the anisotropic conductive film 10A or 10B, positioning can be performed by making an alignment mark on each of the wiring substrate 2, the semiconductor substrates 3A, 3B, and 3C, and the anisotropic conductive film 10A or 10B and matching the alignment marks.

Specifically, when the multilayer substrate is conventionally manufactured by laminating the semiconductor substrates, an alignment mark with a size of several tens μm to several hundreds μm is formed on the semiconductor substrates as one example, and the semiconductor substrates are positioned relative to each other using a CCD or a laser. Since the conductive particles in the anisotropic conductive film are disposed in a monodispersed system or in a lattice, the anisotropic conductive film does not need an alignment mark. However, in the anisotropic conductive film used in the present invention, the conductive particles 11 are selectively disposed in the insulating adhesive layer 12 so as to correspond to the disposition of the through holes to be connected. Therefore, the disposition of the conductive particles 11 can be used in place of the alignment mark. It is preferable that any alignment mark be made on the anisotropic conductive film in addition to such an disposition of the conductive particles.
<Anisotropic Conductive Film>

The anisotropic conductive film of the present invention used in the method for manufacturing a multilayer substrate of the present invention is one in which the conductive particles 11 are selectively disposed in the insulating adhesive layer 12 so as to correspond to the disposition of the through holes to be connected, and the alignment mark is preferably formed therein. It is preferable that the alignment mark be formed by the disposition of the conductive particles. Thus, the alignment mark can be clearly detected, and addition of a new step of making the alignment mark on the anisotropic conductive film is unnecessary. On the other hand, the alignment mark may be formed by partially curing the insulating adhesive layer 12 by laser irradiation or the like. Therefore, the position where the alignment mark is made is easily changed.

A method for manufacturing such an anisotropic conductive film is performed as follows. A metal mold having a convex portion in an disposition corresponding to the disposition of the conductive particles 11 is produced by processing a metal plate by a known processing method such as machining, laser processing, or photolithography. The die is filled with a curable resin. The curable resin is cured, to manufacture a resin mold with inverted concave and convex portions. The conductive particles are put into the concave portion of the resin mold, and a composition for forming an insulating adhesive layer is placed in the resin mold from above the conductive particles, and cured, and the cured product is then taken from the mold.

Alternatively, in order to dispose the conductive particles 11 in the insulating adhesive layer 12 in the predetermined disposition, a method in which a member having penetrating holes in a predetermined disposition is provided on a layer of a composition for forming an insulating adhesive layer, and the conductive particles 11 are supplied over the member and passed through the penetrating holes may be used.
<Conductive Particles Forming Anisotropic Conductive Film>

The conductive particles 11 used in the anisotropic conductive film 10 can be appropriately selected from conductive particles used in a known anisotropic conductive film, and used. Examples thereof may include particles of metals such as solder, nickel, cobalt, silver, copper, gold, and palladium, and metal-coated resin particles. The metal coating of the metal-coated resin particles can be formed using a known metal film forming method such as an electroless plating method or a sputtering method. The metal coating is not particularly limited as long as it is formed on a surface of a core resin material. The core resin material may be formed from only a resin. In order to improve conduction reliability, the core resin material may contain conductive fine particles.

Among the particles described above, it is preferable that as the conductive particles, solder particles be used in terms of conduction reliability and cost. On the other hand, when a reflowing step is unnecessary at a downstream step, it is preferable that the metal-coated resin particles be used. In the present invention, connection between the through holes and bonding between the semiconductor substrates are performed by pressurizing the anisotropic conductive film, in which the conductive particles are disposed in the insulation adhesive layer, under heating. Therefore, when the metal-coated resin particles are used as the conductive particles, pressurizing under heating can be performed at lower temperature. Accordingly, the range of selected material for an insulating adhesive can be expanded.

As the conductive particles, two or more types of particles which are different in size, type, or the like may be used in combination.
<Disposition of Conductive Particles in Anisotropic Conductive Film>

In the anisotropic conductive film, the disposition, particle diameter, and type of the conductive particles 11 are appropriately selected depending on the opening diameter and the like of the through holes in terms of stability of junction between the through holes.

Figure 4A:
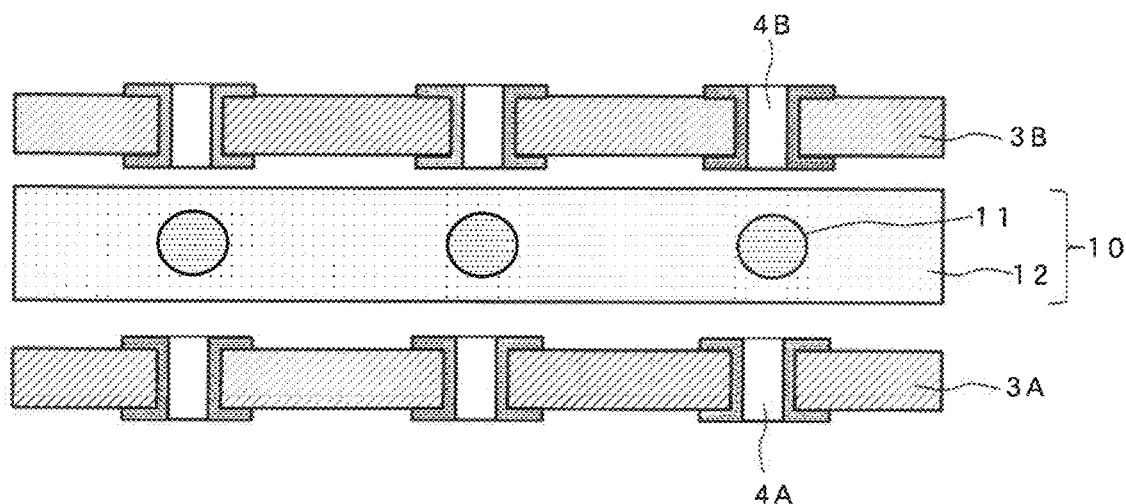
FIG. 4A is a view illustrating a disposition of conductive particles relative to through holes before anisotropic conductive connection.
Figure 4B:
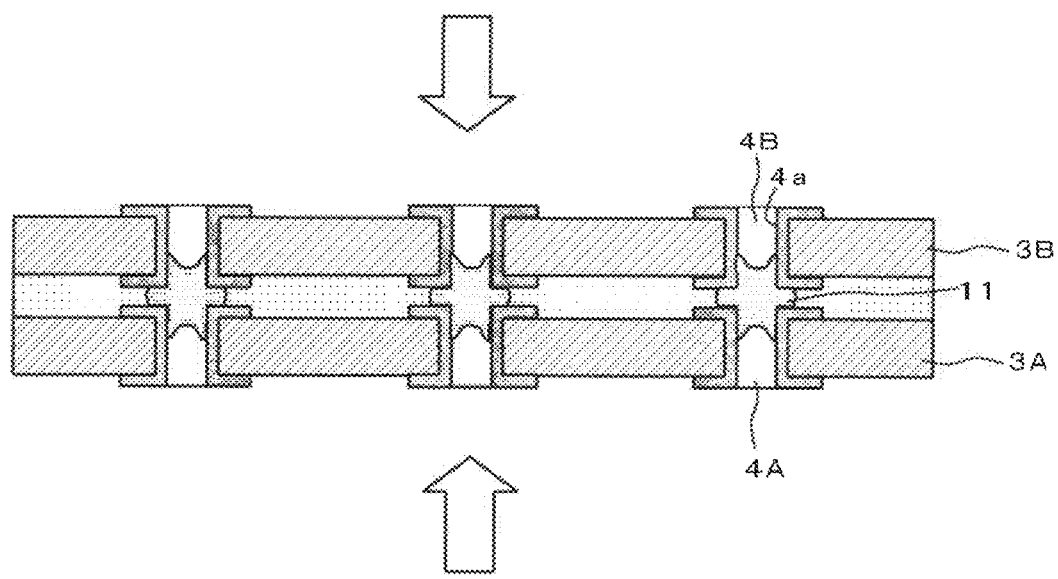
FIG. 4B is a view illustrating the disposition of the conductive particles relative to the through holes after anisotropic conductive connection.

For example, when each one of the conductive particles 11 is disposed at a part where the through holes 4A and 4B face each other as shown in FIGS. 3C and 3D, it is preferable that the particle diameter of the conductive particles 11 be usually larger than the opening diameter of the through holes 4A and 4X. When the conductive particles 11 are formed from solder particles, a plated film 4a of each of the through holes easily gets wet with the solder particle which is molten by pressurizing under heating during anisotropic conductive connection, as shown in FIGS. 4A and 4B. Even in this case, it is preferable that the particle diameter of the conductive particles 11 be equal to or more than the opening diameter of the through holes 4A and 4B. Therefore, the conductive particles 11 are pressed by the through holes 4A and 4B. The through holes 4A and 4B can be certainly connected by the conductive particles 11.

Figure 5A:
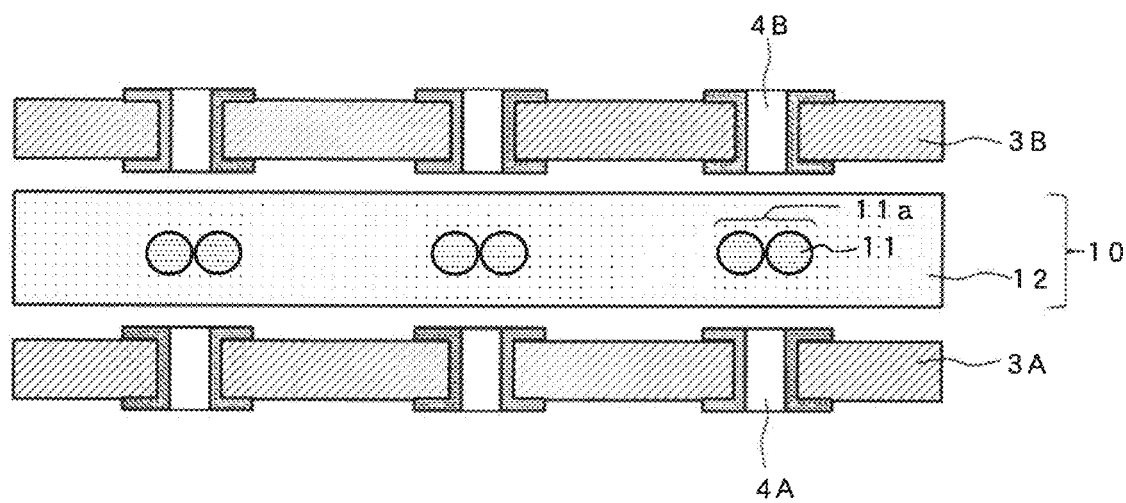
FIG. 5A is a view illustrating a disposition of conductive particles relative to through holes before anisotropic conductive connection.
Figure 5B:
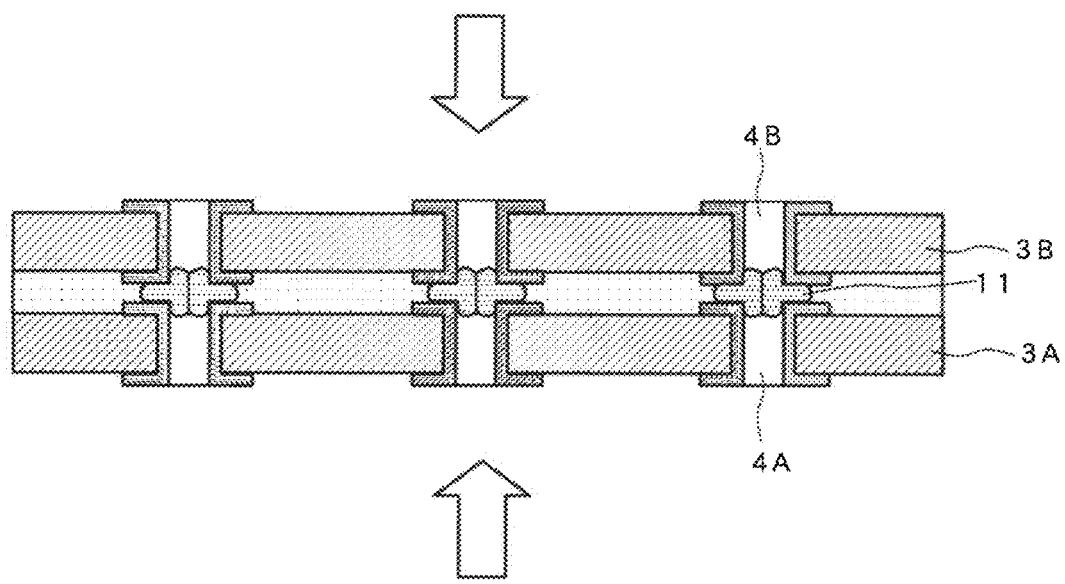
FIG. 5B is a view illustrating the disposition of the conductive particles relative to the through holes after anisotropic conductive connection.

When the particle diameter of the conductive particles is smaller than the opening diameter of the through holes, it is preferable that the diameter of particle group 11a which is formed by plural, adjacent conductive particles 11 be made larger than the opening diameter of the through holes 4A and 4B, like the anisotropic conductive film 10 shown in FIG. 5A, so that the facing through holes 4A and 4B are certainly connected by the conductive particles 11, as shown in FIG. 5B. When the through holes 4A and 4B are connected by the particle group 11a composed of the plural conductive particles, the conduction resistance after connection can be made more robust as compared with a case where each conductive particle is used in each connection.

Figure 6A:
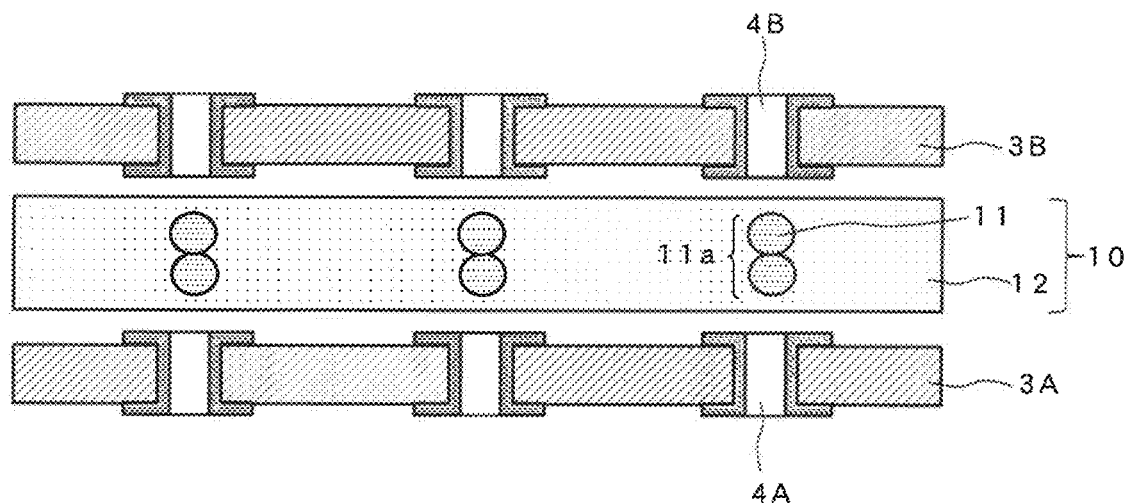
FIG. 6A is a view illustrating a disposition of conductive particles relative to through holes before anisotropic conductive connection.
Figure 6B:
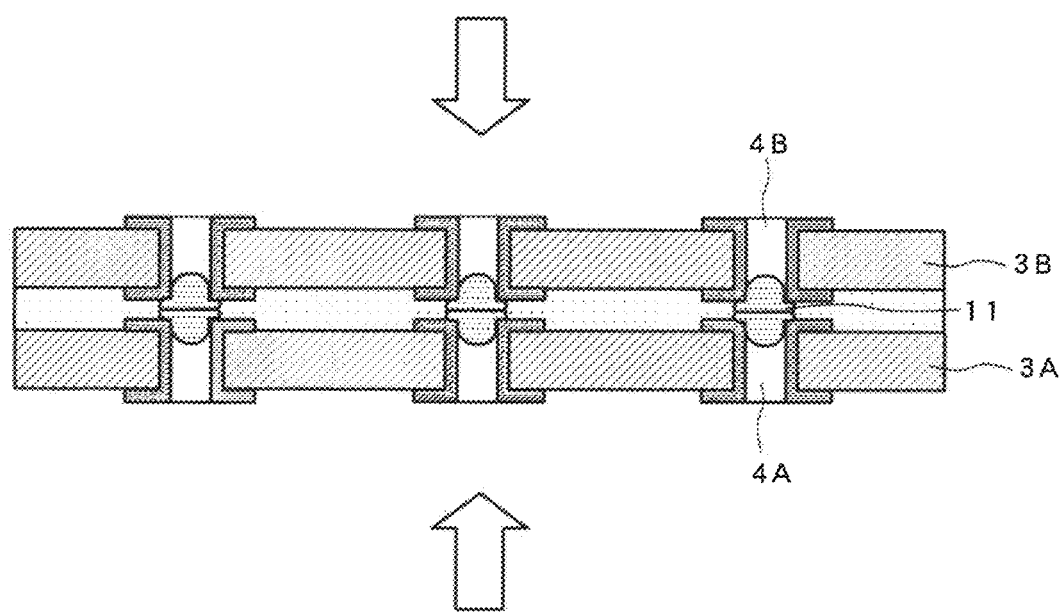
FIG. 6B is a view illustrating the disposition of the conductive particles relative to the through holes after anisotropic conductive connection.

Like the anisotropic conductive film 10 shown in FIG. 6A, the particle group 11a composed of the plural conductive particles 11 may be disposed so that the conductive particles overlap each other in the thickness direction of the anisotropic conductive film 10. Thus, the conductive particles 11 can enter the through holes 4A and 4B to a deeper position, as shown in FIG. 6B.

When the particle group composed of a plurality of adjacent conductive particles 11 is formed so as to correspond to the through holes, the conductive particles may be different in size and type. For example, conductive particles 11p having a larger particle diameter are disposed so as to face the through holes 4A and 4B and conductive particles 11q having a smaller particle diameter are disposed around the conductive particles 11p having a larger particle diameter at a position where the conductive particles 11q are captured by an electrode pad, like the anisotropic conductive film 10 shown in FIG. 7A. In this case, it is preferable that the conductive particles 11p having a larger particle diameter be a conductive particles which are easily deformed as compared with the conductive particles 11q having a smaller particle diameter. When the semiconductor substrates 3A and 3B are pressurized through the anisotropic conductive film 10 under heating, the conductive particles 11p having a larger particle diameter are interposed and held between the through holes 4A and 4B, like a connection structure shown in FIG. 7B, while a space between the through holes 4A and 4B and the conductive particles 11p having a larger particle diameter can be filled with the conductive particles 11q having a smaller particle diameter. The conductive properties between the through holes 4A and 4B and the conductive particles can be improved. In the particle group 11a, when the conductive particles are brought into contact with each other, the contact between the through holes 4A and 4B and the conductive particles are facilitated.

Figure 7A:
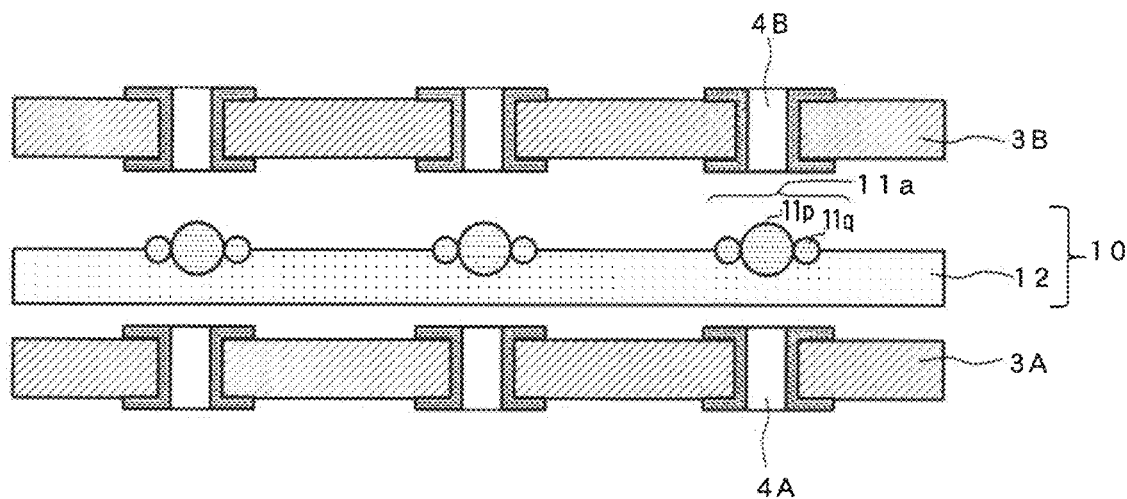
FIG. 7A is a view illustrating a disposition of conductive particles relative to through holes before anisotropic conductive connection.
Figure 7B:
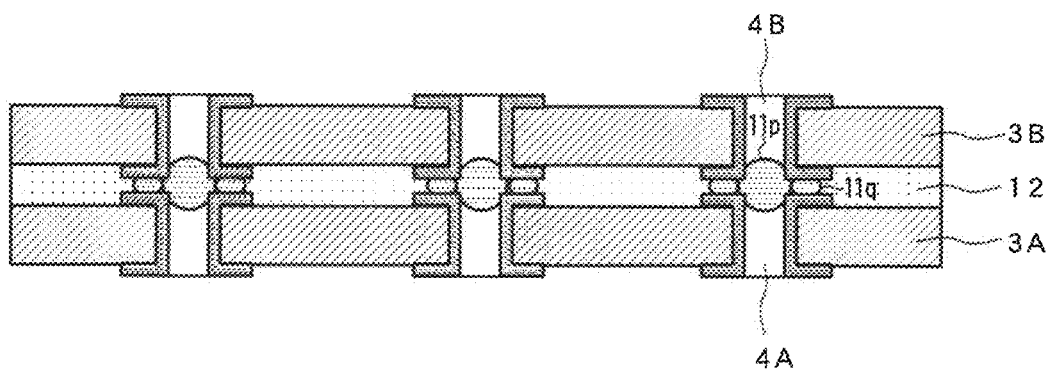
FIG. 7B is a view illustrating the disposition of the conductive particles relative to the through holes after anisotropic conductive connection.
Figure 8:
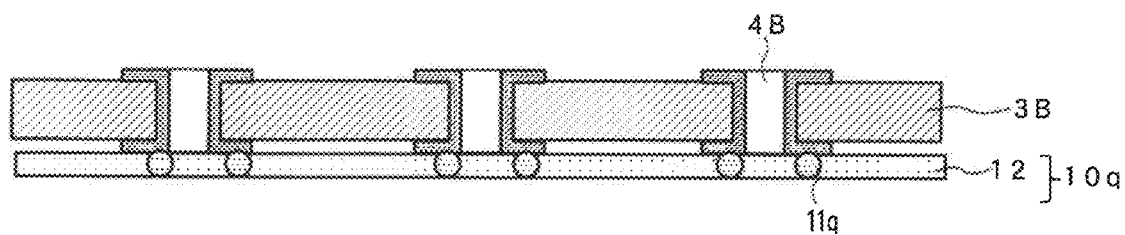
FIG. 8 is a view illustrating a disposition of conductive particles relative to through holes before anisotropic conductive connection.
Figure 8:
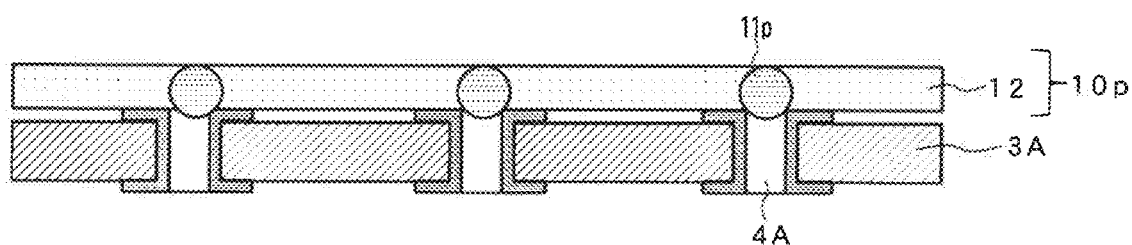

In order to obtain the connection structure shown in FIG. 7B, an anisotropic conductive film 10p having the conductive particles 11p having a larger particle diameter is temporarily bonded to the semiconductor substrate 3A in advance, and an anisotropic conductive film 10q having the conductive particles 11q having a smaller particle diameter is temporarily bonded to the semiconductor substrate 3B, as shown in FIG. 8. Subsequently, the semiconductor substrates 3A and 3B may be pressurized under heating.

In the anisotropic conductive film, the conductive particles may be exposed from the insulating adhesive layer 12, as shown in FIG. 7A. In particular, it is preferable that the conductive particles 11p having a larger particle diameter to be interposed and held between the through holes 4A and 4B be exposed. When the conductive particles are exposed from the insulating adhesive layer, the conductive particles and the through holes are easily aligned. Since the insulating adhesive layer 12 is not present between the conductive particles and the through holes, the conductive properties between the conductive particles and the through holes are improved.

The exposed surface of the conductive particles in the anisotropic conductive film may be protected by covering with a separator film, and the conductive particles may be exposed during use of the anisotropic conductive film.

<Insulating Adhesive Layer>

As the insulating adhesive layer 12 forming the anisotropic conductive film, an insulating resin layer used in a publicly known anisotropic conductive film can be appropriately adopted. For example, a photoradically polymerizable resin layer containing an acrylate compound and a photoradical polymerization initiator, a thermo-radically polymerizable resin layer containing an acrylate compound and a thermo-radical polymerization initiator, a thermo-cationically polymerizable resin layer containing an epoxy compound and a thermo-cationic polymerization initiator, a thermo-anionically polymerizable resin layer containing an epoxy compound and a thermo-anionic polymerization initiator, or the like, can be used. The resin layers may be resin layers obtained by polymerization, if necessary. Further, the insulating adhesive layer 12 may be formed from a plurality of resin layers.

When the multilayer substrate 1A is cut after manufacturing of the multilayer substrate 1A depending on applications such as cutting from the multilayer substrate 1A into a chip, it is preferable that the insulating adhesive layer 12 have flexibility and adhesion which are resistance to cutting.

To the insulating adhesive layer 12, an insulating filler such as a silica fine particle, alumina, or aluminum hydroxide, may be added, if necessary. The amount of the insulating filler to be added is preferably 3 to 40 parts by mass relative to 100 parts by mass of a resin forming the insulating adhesive layer. In this case, even when the insulating adhesive layer 12 is molten during anisotropic conductive connection, unnecessary movement of the conductive particles 11 by the molten resin can be suppressed.

To the insulating adhesive layer 12, an insulating spacer having a particle diameter capable of filling the through hole may be added, if necessary. Thus, uniform pressing is likely to be secured during anisotropic conductive connection.

Before anisotropic conductive connection, a part of the resin of the insulating adhesive layer near the conductive particles may be polymerized, in advance. Thus, the through holes and the conductive particles are easily aligned. Further, a risk of occurrence of short circuit can be decreased.

Modified Embodiment

In the anisotropic conductive film 10 described above, there is almost no conductive particles which are present at a position other than the predetermined positions. Among conductive particles present at the predetermined position, there may be a conductive particle which is not captured by the through holes 4A and 4B facing each other. Therefore, the number of the conductive particles 11 which are not captured by the through holes 4A and 4B between the facing semiconductor substrates 3A and 3B after connection between the semiconductor substrates 3A and 3B using the anisotropic conductive film 10 is preferably 5% or less relative to the total number of the conductive particles 11 which are present between the facing semiconductor substrates 3A and 3B.

Figure 9:
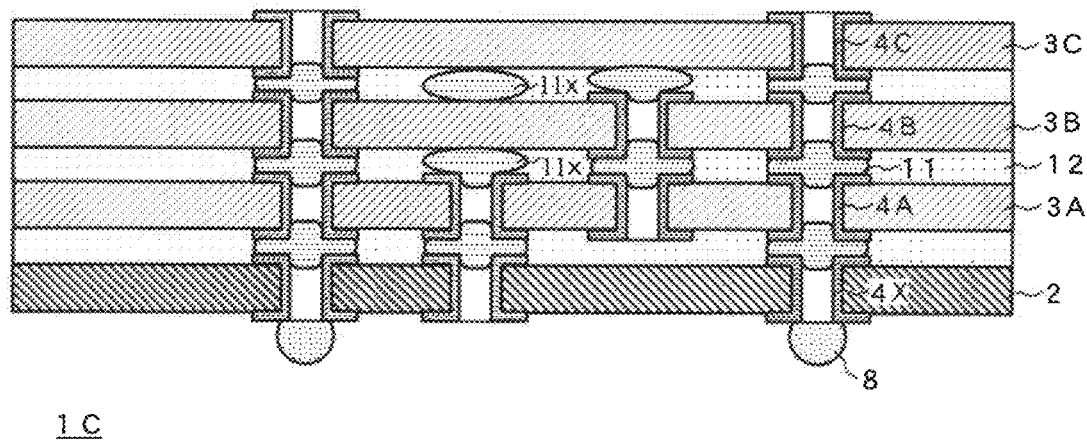
FIG. 9 is a cross-sectional view of a multilayer substrate 1C of an embodiment of the present invention.

On the other hand, a multilayer substrate 1C shown in FIG. 9 is manufactured using a common anisotropic conductive film as the anisotropic conductive film which connects the through hole 4X of the wiring substrate 2 to the through hole 4A of the first semiconductor substrate 3A, the anisotropic conductive film which connects the through hole 4A of the first semiconductor substrate 3A to the through hole 4B of the second semiconductor substrate 3B, and the anisotropic conductive film which connects the through hole 4B of the second semiconductor substrate 3B to the through hole 4C of the third semiconductor substrate 3C in the multilayer substrate 1A shown in FIG. 1. Specifically, as the anisotropic conductive film, an anisotropic conductive film is used in which the conductive particles 11 are selectively disposed in the insulating adhesive layer 12 so as to correspond to a part where the through holes of the wiring substrate 2 and the semiconductor substrates 3A, 3B, and 3C face each other as viewed in a plan view of the multilayer substrate 1C to be manufactured. Therefore, the conductive particles 11 and 11x are present at a part where the through holes 4X, 4A, 4B, and 4C face each other as viewed in a plan view of the multilayer substrate 1C. Specifically, there is not necessarily a conductive particle which is selectively disposed relative to only the through holes between the facing through holes. For example, between the semiconductor substrates 3A and 3B, the conductive particles 11 are selectively disposed at a position where the through holes 4A and 4B formed in the semiconductor substrates 3A and 3B face each other. In addition thereto, the conductive particle 11x which does not contribute to connection between the through hole 4A of the first semiconductor substrate 3A and the through hole 4B of the second semiconductor substrate 3B is also present. Therefore, the conductive particle which is not captured by the through holes between the semiconductor substrates 3A and 3B may be present at a ratio of more than 5% relative to all the conductive particles which are present between the semiconductor substrates 3A and 3B. However, the conductive particle 11x which is present between the semiconductor substrates 3A and 3B and does not contribute to connection between the semiconductor substrates 3A and 3B contributes to connection between the through hole 4X of the wiring substrate 2 and the through hole 4A of the first semiconductor substrate 3A. The conductive particle is not disposed or is not substantially present at a position where the through holes do not face each other as viewed in a plan view of the multilayer substrate 1C.

When the respective semiconductor substrates are connected using the common anisotropic conductive film, as described above, the total cost for manufacturing of the multilayer substrate can be decreased. This can be easily applied to an increase in lineup of the multilayer substrate (change in specification). In this anisotropic conductive film, the conductive particles can also be disposed as a particle group composed of a plurality of adjacent conductive particles.

When the semiconductor substrates are connected using the common anisotropic conductive film to decrease the total cost for manufacturing of the multilayer substrate, a multilayer substrate may be manufactured using an anisotropic conductive film in which the particle groups 11a are disposed over a surface. In this case, the number of conductive particles constituting each particle group 11a is 3 or more, preferably 10 or more, and more preferably 12 or more. The distance between the particle group 11a and the next particle group 11a is one or more times larger than the diameter of the conductive particles to avoid occurrence of short circuit. The distance is appropriately set depending on an interval between the through holes of the semiconductor substrate. When the anisotropic conductive film in which the particle groups 11a are disposed at appropriate intervals over one surface is commonly used, the manufacturing cost for the multilayer substrate can be largely decreased, as compared with a case of using anisotropic conductive films having conductive particles in different dispositions depending on the semiconductor substrates to be connected.

In the anisotropic conductive film commonly used in each semiconductor substrate, the disposition, particle diameter, and type of a plurality of conductive particles constituting the particle group are appropriately selected in terms of stability of junction between the through holes, as described above. Each particle group may contain a plurality of conductive particles which are different in at least size or type. In each particle group, the conductive particles may overlap each other in the thickness direction of the anisotropic conductive film. In each particle group, the conductive particles may be disposed in a plane direction of the anisotropic conductive film. At least one part of the conductive particles contained in the particle group may be exposed from the insulating adhesive layer.

As described above, in the multilayer substrate of the present invention, the conductive particles are selectively present at a position where the through holes face each other as viewed in a plan view of the multilayer substrate. The facing through holes are connected by the conductive particles disposed as described above, and the semiconductor substrates each having the through hole are bonded by the insulating adhesive. In this case, the facing through holes may be connected by the conductive particles 11 which are selectively disposed only between the facing through holes. The conductive particles 11x which do not contribute to connection between the facing through holes may be present between the semiconductor substrates 3A, 3B, and 3C which have the facing through holes.

The multilayer substrate of the present invention can be used in various applications of various types of semiconductors required for high-density mounting, including a high-density semiconductor package. The multilayer substrate may be cut into a predetermined size for use.

EXAMPLES

Hereinafter, the present invention will be described specifically with reference to Examples.

Examples 1 to 6, and Comparative Example 1

(1) Semiconductor Substrate

Figure 10:
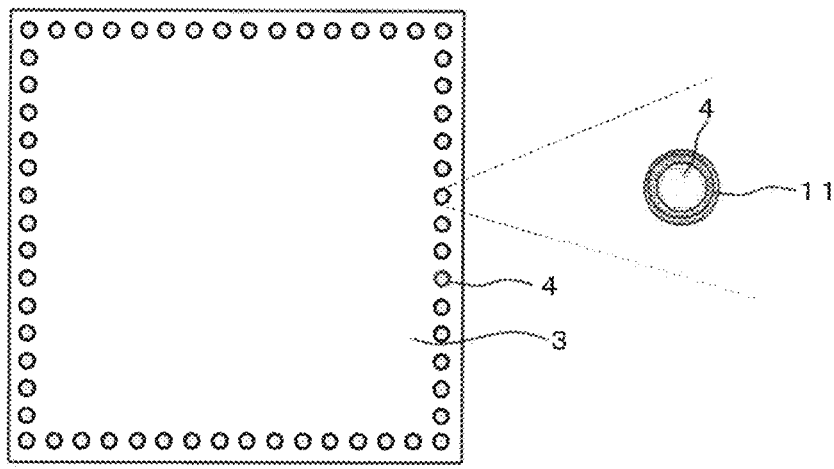
FIG. 10 is a disposition view of electrodes and conductive particles in a surface of a semiconductor substrate used in manufacturing of a multilayer substrate of Example 1.

As a semiconductor substrate 3 constituting a multilayer substrate, a semiconductor substrate which had a rectangle with a 7-mm square outline and a thickness of 100 μm and had through holes 4 having a chromium electrode pad in a peripheral disposition (diameter: 30 μm, pitch: 85 μm, 280 pins), as shown in FIG. 10, was prepared.

In the semiconductor substrate, a 200-μm square mark was formed as an alignment mark.

(2) Manufacturing of Anisotropic Conductive Film

As shown in Table 1, each anisotropic conductive film having conductive particles with a particle diameter shown in Table 1 (fine solder powder, MITSUI MINING & SMELTING CO., LTD.) which was randomly dispersed in an insulating adhesive layer (in Comparative Example 1, particle density: 60 particles/mm$^2$) or disposed so as to correspond to the disposition of the through holes 4 of the semiconductor substrate (in Examples 1 to 6, pitch: 85 μm, 280 positions) was manufactured.

Figure 11:
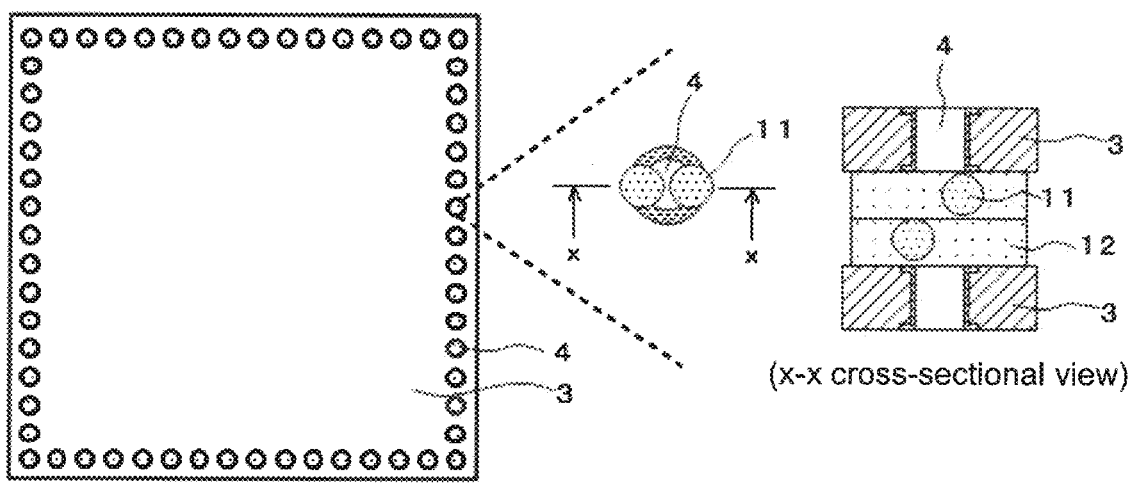
FIG. 11 is a disposition view of electrodes and conductive particles in a surface of a semiconductor substrate used in manufacturing of a multilayer substrate of Example 4.
Figure 12:
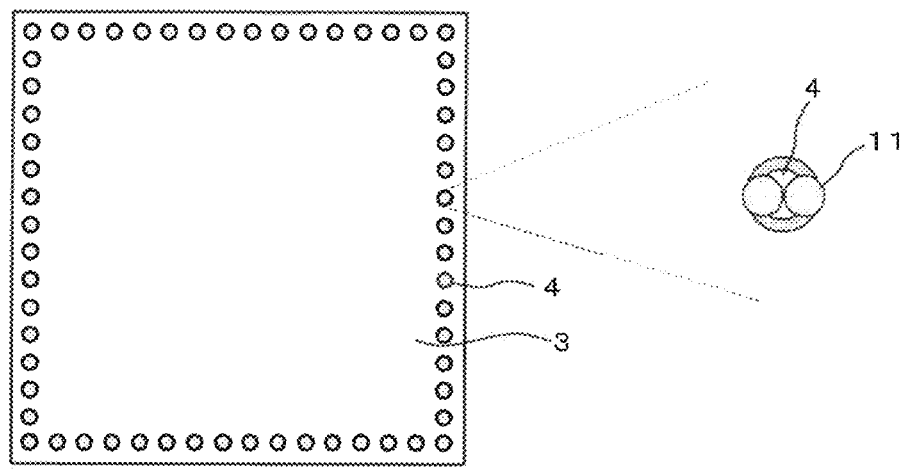
FIG. 12 is a disposition view of electrodes and conductive particles in a surface of a semiconductor substrate used in manufacturing of a multilayer substrate of Example 5.
Figure 13:
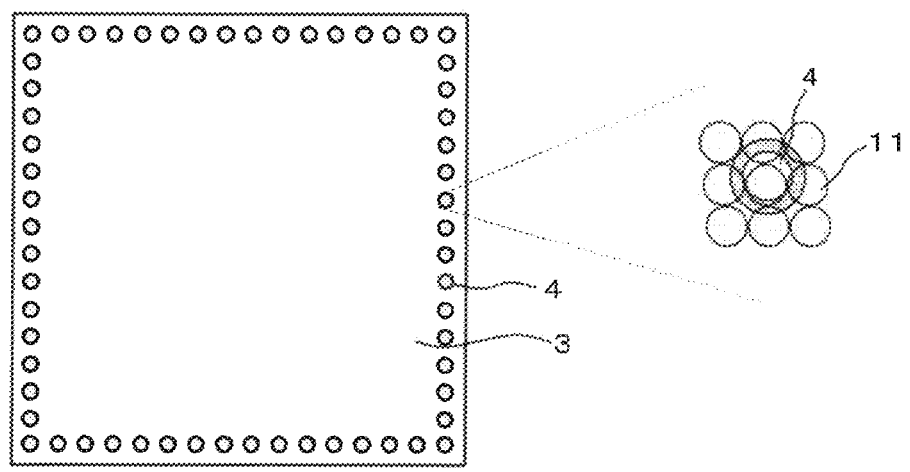
FIG. 13 is a disposition view of electrodes and conductive particles in a surface of a semiconductor substrate used in manufacturing of a multilayer substrate of Example 6.
Figure 14:
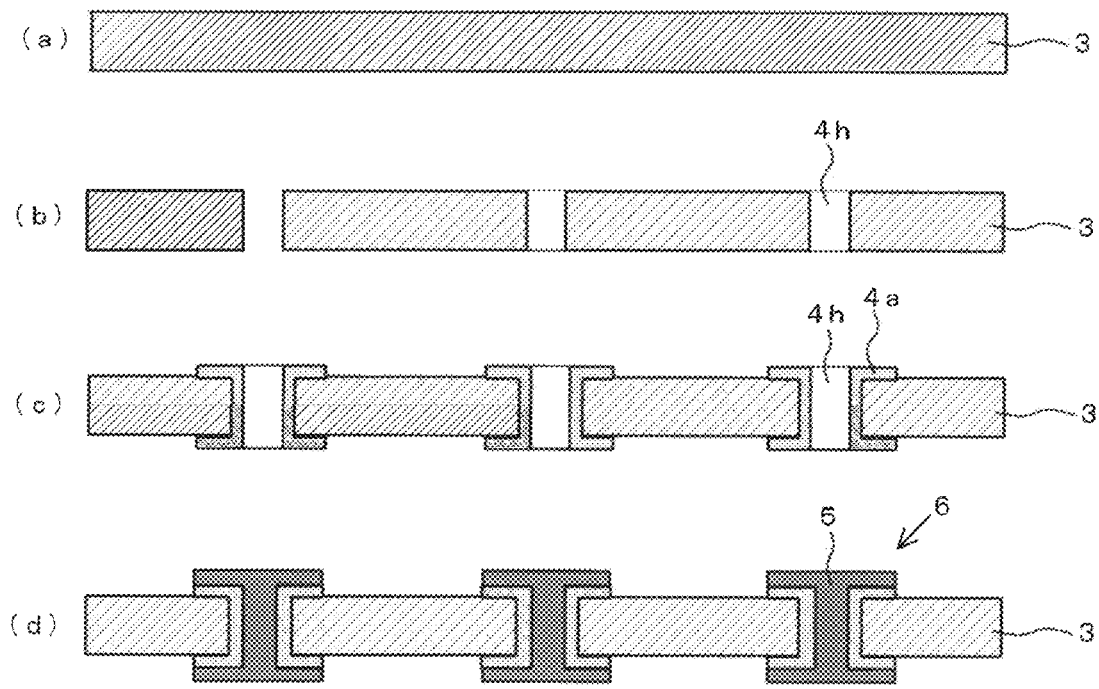
FIG. 14 is a view illustrating steps in a method for manufacturing a through electrode.

In Examples 1, 2, and 3, each one of conductive particles 11 was disposed at each terminal electrode of the through hole 4, as shown in FIG. 10. In Example 4, an insulating adhesive layer 12 was composed of two layers, and the conductive particles 11 were disposed in each layer of the insulating adhesive layer 12 so that two conductive particles 11 per terminal electrode of the through hole 4 were disposed side by side in a film thickness direction, as shown in FIG. 11. In Example 5, two conductive particles 11 per terminal electrode of the through hole 4 were disposed side by side in a film plane direction, as shown in FIG. 12. In Example 6, nine conductive particles 11 per terminal electrode of the through hole 4 were disposed side by side in the film plane direction, as shown in FIG. 13.

In Examples 1 to 6, an alignment mark was made by the conductive particles. In these cases, the outline of arrangement of the conductive particles was substantially matched with the outline of alignment mark of the semiconductor substrate 3.

More specifically, a nickel plate having a thickness of 2 mm was prepared, and a transfer master was produced by patterning so that a convex portion (diameter: 30 to 45 μm, height: 25 to 40 μm, for example, in Example 1, the diameter was 45 μm and the height was 40 μm) was disposed in the disposition of the conductive particles described above. A binder obtained by mixing 50 parts by mass of a phenoxy resin (YP-50, NIPPON STEEL & SUMIKIN CHEMICAL CO., LTD.), 30 parts by mass of a microencapsulated imidazole compound latent curing agent (NOVACURE HX3941HP, ASAHI KASEI E-materials Corporation), and 20 parts by mass of fumed silica (AEROSIL RY200, NIPPON AEROSIL CO., LTD.) was applied to a polyethylene terephthalate (PET) film so that the dry thickness was 50 μm. The film was laminated so that the binder faced the transfer master, and the binder was dried at 80° C. for 5 minutes, and irradiated with light of 1,000 mJ by a high-pressure mercury lamp to obtain a transfer mold having a concave portion.

A composition for forming an insulating adhesive was prepared from 60 parts by mass of a phenoxy resin (YP-50, NIPPON STEEL & SUMIKIN CHEMICAL CO., LTD.), 40 parts by mass of an epoxy resin (jER828, Mitsubishi Chemical Corporation), and 2 parts by mass of a cationic curing agent (SI-60L, SANSHIN CHEMICAL INDUSTRY CO., LTD.). This composition was applied to a PET film having a thickness of 50 μm, and dried in an oven of 80° C. for 5 minutes, to form an adhesive layer of the insulating resin having a thickness of 30 μm on the PET film.

The transfer mold having the aforementioned concave portion was filled with conductive particles, and the conductive particles were coated with the adhesive layer of the insulating resin described above. A thermosetting resin contained in the insulating resin was cured by irradiation with ultraviolet rays. The insulating resin was separated from the mold, and the conductive particles were pushed so that the ends of the conductive particles were aligned with the interface. Thus, the anisotropic conductive films in Examples 1 to 3 were manufactured. In Example 4, the anisotropic conductive film having two insulating adhesive layers was manufactured by laminating at 60° C. and 0.5 MPa insulating adhesive layers which were obtained by changing the thickness of the adhesive layer to 25 μm and separating the layer from the mold in the same manner as described above. In Examples 5 and 6, the anisotropic conductive film was manufactured by laminating at 60° C. and 0.5 MPa on an adhesive layer, which was produced by changing the thickness of the adhesive layer to 15 μm and separating the layer from the mold in the same manner as described above, another insulating resin layer (thickness: 15 μm), which was produced similarly to the adhesive layer, on a side of conductive particles of the adhesive layer.

The anisotropic conductive film in Comparative Example 1 in which the conductive particles were randomly dispersed was manufactured by stirring the conductive particles and the insulating resin by a planetary centrifugal mixer (Thinky Corporation) to obtain a dispersion including the conductive particles, and forming a coating film of the dispersion so as to have a thickness of 30 μm.

(3) Manufacturing of Multilayer Substrate

The semiconductor substrates prepared in (1) were laminated using the anisotropic conductive film manufactured in (2) so that the number of semiconductor substrates laminated was the number shown in Table 1, and pressed, and further pressurized under heating (180° C., 40 MPa, 20 seconds) to manufacture a multilayer substrate.

(4) Evaluation

For the obtained multilayer substrate, (a) evaluation of filling and (b) evaluation of melting were performed as follows. The results are shown in Table 1.

(a) Evaluation of Filling

A case where the conductive particles were present between the facing through holes when the semiconductor substrates were laminated and pressed was determined to be OK, and a case where the conductive particles were not present was determined to be NG.

(b) Evaluation of Melting

The cross section of the multilayer substrate in the thickness direction was observed. At that time, a case where the facing through holes were connected by the conductive particles and the molten substance of the conductive particles entered the through holes along the inner wall thereof was evaluated as a rank A. A case where the facing through holes were connected by the conductive particles, but the molten substance of the conductive particles did not enter the through holes along the inner wall thereof was evaluated as a rank B.

TABLE 1

| | Comparative Example 1 | Example 1 | Example 2 | Example 3 | Example 4 | Example 5 | Example 6 |
|---|---|---|---|---|---|---|---|
| Number of Laminated Semiconductor Substrates | 2 | 2 | 3 | 2 | 2 | 2 | 2 |

TABLE 1-continued

|  | Comparative Example 1 | Example 1 | Example 2 | Example 3 | Example 4 | Example 5 | Example 6 |
|---|---|---|---|---|---|---|---|
| Opening Diameter of Through Hole (μm) | 30 | 30 | 30 | 30 | 30 | 30 | 30 |
| Particle Diameter of Conductive Particles (μm) | 5 | 40 | 40 | 30 | 25 | 25 | 25 |
| Disposition of Conductive Particles Relative to One Through Hole | Random | 1 | 1 | 1 | 2 in Film Thickness Direction | 2 in Film Plane direction | 9 in Film Plane direction |
| Evaluation of Filling | NG | OK | OK | OK | OK | OK | OK |
| Evaluation of Melting | — | A | A | B | B | B | B |

In the multilayer substrate in Comparative Example 1, many through holes to cause failure of filling were formed. In the multilayer substrates in Examples 1 to 6, filling was good, and connection between the through holes by the conductive particles was confirmed. In particular, in Example 6, the allowed width of shifting between the dispositions of the through holes and the conductive particles was large.

REFERENCE SIGNS LIST 1A, 1B multilayer substrate
2 wiring substrate
3, 3A, 3B, 3C semiconductor substrate
4, 4A, 4B, 4C through hole
4a plated film
4h penetrating hole
5 metal
6 through electrode
7 heat sink
8 solder ball
9 electrode pad
10, 10A, 10B anisotropic conductive film
11, 11p, 11q conductive particle
11a particle group
12 insulating adhesive or insulating adhesive layer

The invention claimed is:

1. A multilayer substrate comprising:
semiconductor substrates each having a through hole of a plurality of through holes and a plated film on an inner surface thereof, the semiconductor substrates being laminated to each other, wherein:
a particle group formed from a plurality of adjacent conductive particles is present at least at a position where a first pair of the through holes face each other as viewed in a first direction corresponding to a plan view of the multilayer substrate, wherein each conductive particle in the particle group includes a metal coating and a core resin material, and
the multilayer substrate has a connection structure in which the first pair of the through holes are connected by the particle group, and the semiconductor substrates are bonded together by an insulating adhesive, wherein a first conductive particle in the particle group includes a first surface directly contacting the insulating adhesive, the first surface protruding convexly towards the insulating adhesive as viewed in a second direction, and
the second direction is perpendicular to the first direction.

2. The multilayer substrate according to claim 1, wherein the semiconductor substrates include a first semiconductor substrate having a first through hole of the first pair of the through holes and a second semiconductor substrate having a second through hole of the first pair of the through holes, the first semiconductor substrate and the second semiconductor substrate being laminated to each other, and the first through hole of the first semiconductor substrate and the second through hole of the second semiconductor substrate are connected by at least the first conductive particle, and the first conductive particle is disposed between the first and second through holes.

3. The multilayer substrate according to claim 2, wherein:
the semiconductor substrates include a third semiconductor substrate having a third through hole, the third semiconductor substrate being laminated on the second semiconductor substrate,
the second through hole of the second semiconductor substrate is connected to the first through hole of the first semiconductor substrate by the first conductive particle,
the third through hole of the third semiconductor substrate faces the second through hole, and is connected to the second through hole by at least a second conductive particle disposed between the second and third through holes facing each other, and
the connection structure bonds the second and third semiconductor substrates by the insulating adhesive.

4. The multilayer substrate according to claim 1, wherein the conductive particles of the particle group are inside the through holes.

5. The multilayer substrate according to claim 1, further comprising a heat sink on an outermost layer of the multilayer substrate, wherein the heat sink is connected to the through holes connected in the first direction of the multilayer substrate by connecting to the conductive particles of the particle group.

6. The multilayer substrate according to claim 1, wherein the first pair of the through holes are connected by at least the first conductive particle.

7. The multilayer substrate according to claim 1, wherein a particle diameter of the conductive particles in the particle group is greater than an opening diameter of the through holes.

8. The multilayer substrate according to claim 1, wherein a diameter of the particle group is greater than the opening diameter of the though holes.

9. The multilayer substrate according to claim 1, wherein a particle diameter of the conductive particles in the particle group is less than the opening diameter of the though holes.

10. The multilayer substrate according to claim 1, wherein the conductive particles in the particle group are disposed so that the conductive particles overlap each other in a thickness direction of the insulating adhesive.

11. A multilayer substrate comprising:
semiconductor substrates each having a through hole of a plurality of through holes and a plated film on an inner surface thereof, the semiconductor substrates being laminated to each other, wherein:
a particle group formed from a plurality of adjacent conductive particles is present at least at a position where a first pair of the through holes face each other as viewed in a first direction corresponding to a plan view of the multilayer substrate, and
the multilayer substrate has a connection structure in which the first pair of the through holes are connected by the particle group, and the semiconductor substrates are bonded together by an insulating adhesive, wherein the conductive particles in the particle group are disposed in a plane direction of the insulating adhesive,
a first conductive particle in the particle group includes a first surface directly contacting the insulating adhesive, the first surface protruding convexly towards the insulating adhesive as viewed in a second direction, and
the second direction is perpendicular to the first direction.

12. A method for manufacturing a multilayer substrate in which through holes, each having a plated film on an inner surface thereof, are formed in semiconductor substrates which are faced and laminated to each other, the method comprising:
putting a particle group between each of the semiconductor substrates, each semiconductor substrate having a through hole of the through holes, the particle group formed from a plurality of adjacent conductive particles, wherein each conductive particle in the particle group includes a metal coating and a core resin material, each conductive particle corresponding to a position where at least a first pair of the through holes face each other as viewed in a first direction corresponding to a plan view of the multilayer substrate such that the multilayer substrate has a connection structure in which the first pair of the through holes is connected by the particle group, and the semiconductor substrates are bonded together by an insulating adhesive anisotropic conductive film; and
pressurizing the connection structure under heating to achieve an anisotropic conductive connection of the semiconductor substrates such that a first conductive particle in the particle group includes a first surface directly contacting the insulating adhesive and the first surface protrudes convexly towards the insulating adhesive as viewed in a second direction, wherein the second direction is perpendicular to the first direction.

13. The method for manufacturing a multilayer substrate according to claim 12, wherein a first through hole of the through holes of a first semiconductor substrate of the semiconductor substrates and a second through hole of the through holes of a second semiconductor substrate of the semiconductor substrates face each other and define the first pair of the through holes,
the method further comprising:
putting a first anisotropic conductive film between the first semiconductor substrate and the second semiconductor substrate, the first anisotropic conductive film including at least the first conductive particle, the first conductive particle being disposed in the insulating adhesive of the first anisotropic conductive film at a position corresponding to a position of the first and second through holes, and
pressurizing the first anisotropic conductive film under heating to achieve an anisotropic conductive connection of the first and second semiconductor substrates.

14. The method for manufacturing a multilayer substrate according to claim 13, wherein a third semiconductor substrate of the semiconductor substrates having a third through hole is laminated on the second semiconductor substrate, and a second anisotropic conductive film including at least a second conductive particle disposed in the insulating adhesive of the second anisotropic conductive film at a position corresponding to a position of the second and third through holes, the third through hole of the third semiconductor substrate is connected to the first and second through holes by the first and second conductive particles, and the second anisotropic conductive film is pressurized under heating to achieve an anisotropic conductive connection of the second and third semiconductor substrates.

15. The method according to claim 12, wherein the pair of the through holes are connected by at least the first conductive particle.

16. The method according to claim 12, wherein a particle diameter of the conductive particles in the particle group is greater than an opening diameter of the through holes.

17. The method according to claim 12, wherein a diameter of the particle group is greater than the opening diameter of the though holes.

18. The method according to claim 12, wherein a particle diameter of the conductive particles in the particle group is less than the opening diameter of the though holes.

19. The method according to claim 12, wherein the conductive particles in the particle group are disposed in a plane direction of the insulating adhesive.

20. The method according to claim 12, wherein the conductive particles in the particle group are disposed so that the conductive particles overlap each other in a thickness direction of the insulating adhesive.

* * * * *